United States Patent [19]

Heller et al.

[11] Patent Number: 4,566,503

[45] Date of Patent: Jan. 28, 1986

[54] APPARATUS AND METHOD OF SETTING UP APPARATUS FOR SHAPING AND TRIMMING THE LEADS OF INTEGRATED COMPONENTS

[75] Inventors: Martin G. Heller, 68 Harvey Dr., Short Hills, N.J. 07078; Edward Pecha, Fairlawn, N.J.; Douglas Smith, Pompton Lakes, N.J.; Philip Alcock, Morris Plains, N.J.

[73] Assignee: Martin G. Heller, Short Hills, N.J.

[21] Appl. No.: 560,846

[22] Filed: Dec. 13, 1983

[51] Int. Cl.$^4$ .............................................. B21F 1/02
[52] U.S. Cl. .................................... 140/140; 140/105; 140/147; 29/593
[58] Field of Search ....................... 140/105, 140, 147; 83/417, 578, 279, 280, 925 R; 29/33 M, 33 F, 34 D, 593, 566.3

[56] References Cited

U.S. PATENT DOCUMENTS

| | | | |
|---|---|---|---|
| 4,003,414 | 1/1977 | Halligan | 140/147 |
| 4,020,880 | 5/1977 | Heller et al. | 29/593 |
| 4,103,719 | 8/1978 | Witt | 140/147 |
| 4,106,532 | 8/1978 | Gubitose et al. | 140/147 |
| 4,108,217 | 8/1978 | Westberg | 140/105 |

Primary Examiner—Francis S. Husar
Assistant Examiner—Jerry Kearns
Attorney, Agent, or Firm—Ralph R. Roberts

[57] ABSTRACT

This invention provides an apparatus and method of setting up apparatus for the automatic cutting and/or shaping of IC components carried in a tubular carrier and advanced for processing by gravity. A base plate is disposed at an angle of approximately forty degrees to the horizontal and provides a supporting means for gravitational feeding of these components from a removable U-shaped retainer to a guide and then to a die station. At this die station a resiliently tired feed wheel engages the body of the IC component which is metered and advanced with an intermittent motion. This motion is provided in a timed relationship with two rotating shafts which have pins moved in a precise orbit around a shaft centerline. These pins are one-hundred-eighty degrees out-of-phase with each other. The rotated feed wheel and attached tire are intermittently moved in a strict timed relationship to the movement of the two shafts by a one-way clutch driven by one of the shafts and by an eccentrically moved Pitman arm. The several stations in this apparatus retain these components by clamp means and manipulable thumb screws.

27 Claims, 59 Drawing Figures

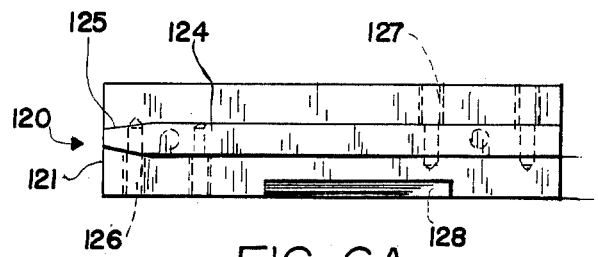
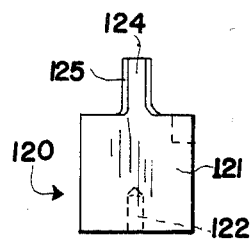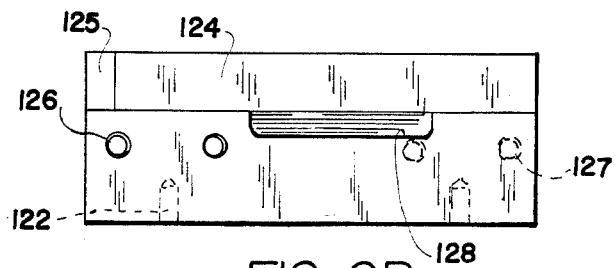
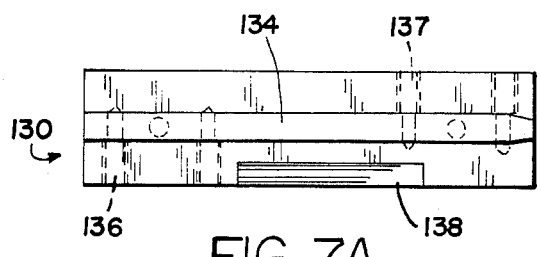
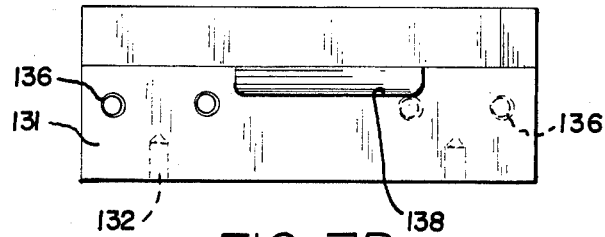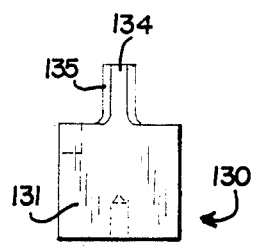

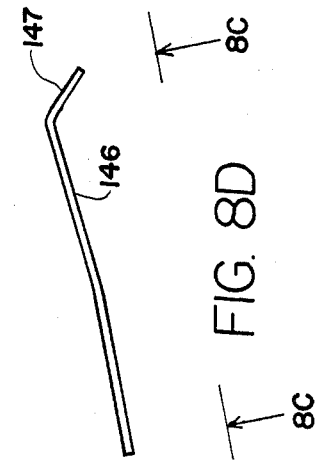
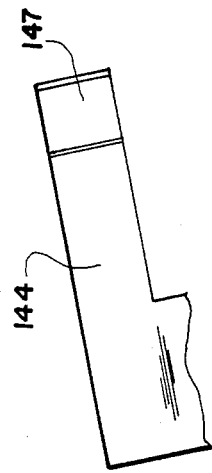
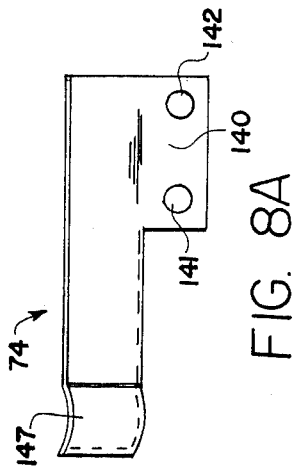
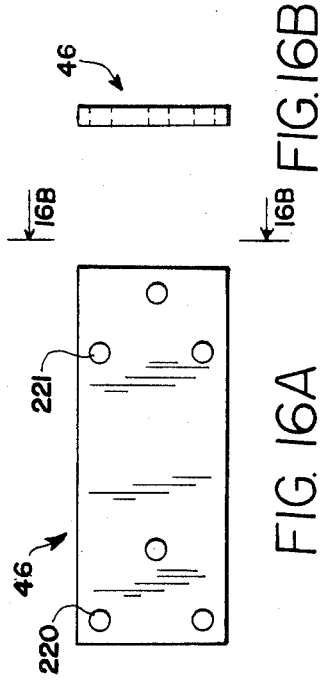

FIG. 12A
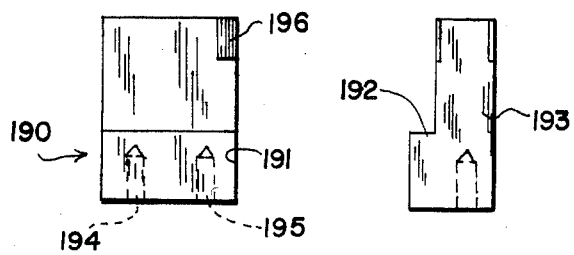
FIG. 12B　　　FIG. 12C
FIG. 11A
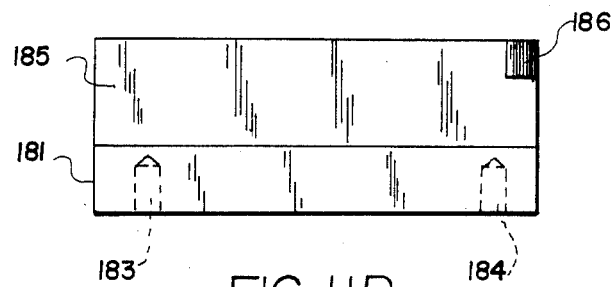 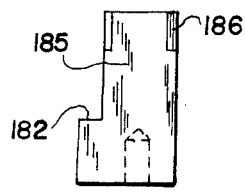
FIG. 11B　　　FIG. 11C

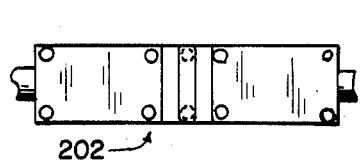
FIG. 13A
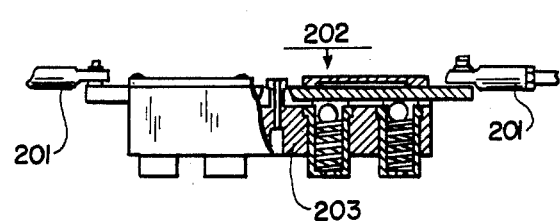
FIG. 13B
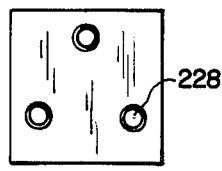
FIG. 16D
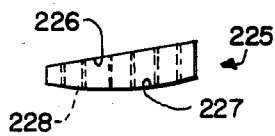
FIG. 16C
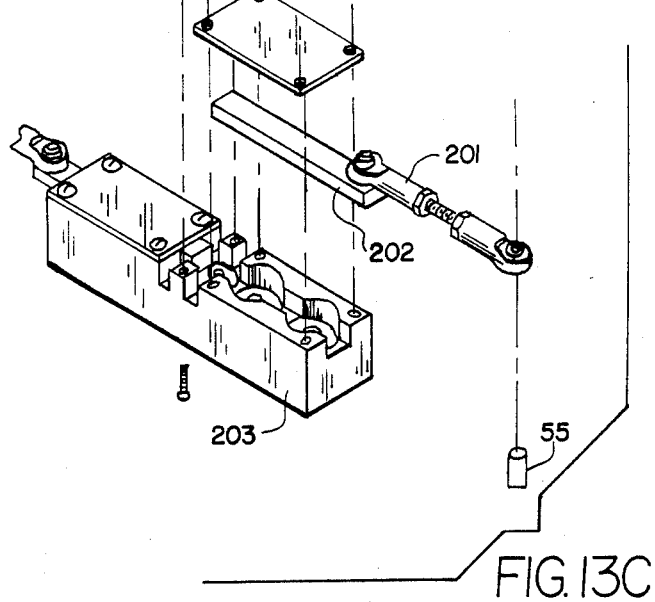
FIG. 13C
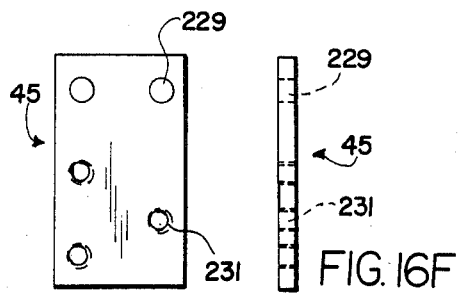
FIG. 16E
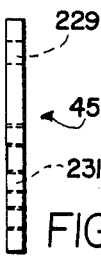
FIG. 16F

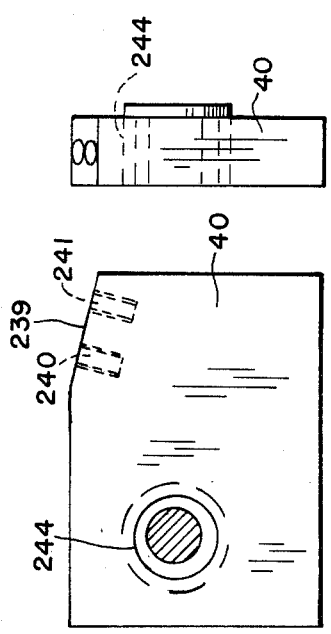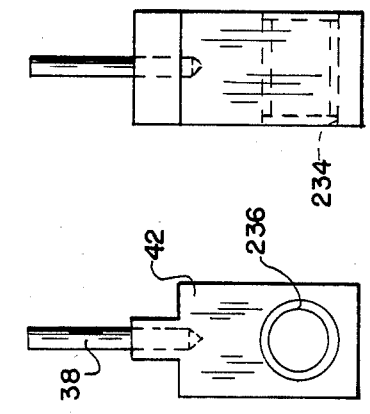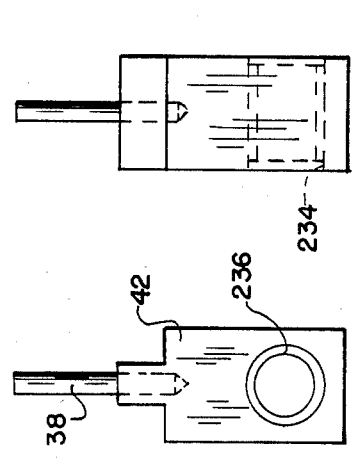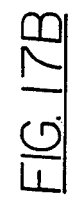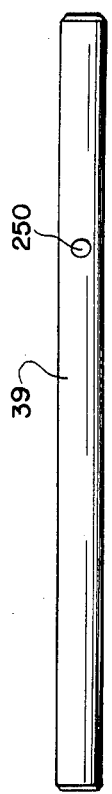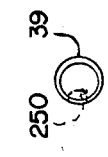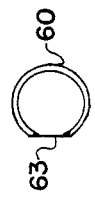

APPARATUS AND METHOD OF SETTING UP APPARATUS FOR SHAPING AND TRIMMING THE LEADS OF INTEGRATED COMPONENTS

CROSS REFERENCE TO RELATED ISSUED PATENT

To the extent applicable, this invention pertains to the method and apparatus disclosed and claimed in U.S. Pat. No. 4,020,880 as issued to Heller et al on May 3, 1977.

BACKGROUND OF THE INVENTION

1. Field of the Invention

With reference to the classification of art as established in and by the U.S. Patent Office this invention is believed to be found in the general class of wire working and in the general class of metal deforming. In particular, this invention pertains to printed circuit components and bending and trimming the leads of such components. This apparatus and method pertains to high speed processing of I.C. components carried in a U-shaped plastic carrier and guide.

2. Description of the Prior Art

In addition to the patent above noted there are several U.S. patents among which are U.S. Pat. No. 4,003,414 to HALLIGAN as issued January 1977; 4,103,719 to WITT as issued August 1978; 4,106,532 to GUBITOSE et al as issued August 1978; 4,108,217 to WESTBERG II as issued August 1978; 4,135,557 to ROSS et al as issued January 1979, and 4,371,012 to WERESCH as issued February 1983.

For the purpose of identification "I.C." hereinafter represents "Integrated Circuit Components". Such an abbreviation is an acceptable form of identification in the industry. The bending, straightening and trimming of leads of an I.C. component in a high speed manner is required with present day apparatus. Adjustability of dies and replacement is shown in several of the patents above noted but the accommodation of the component array and spacing of the leads of the components for ready adaption is novel. The use of dies to shape and cut the leads of I.C.'s is well known but the manufacturer of electrical devices using P.C. boards may employ I.C's with four tenths inches centers and also I.C.'s with three tenths inch and six tenths inch spacing. This spacing is now being used for compactness of units and also for ready identification of components.

SUMMARY OF THE INVENTION

This invention may be summarized, at least in part, with reference to its objects.

It is an object of this invention to provide, and it does provide, gravitational feeding of I.C. components while still in their plastic U-shaped guide retainers to shaping and trimming dies and after processing to further feed and accumulate these I.C. components in like U-shaped plastic retainers.

It is a further object of this invention to provide, and it does provide, an adjustable feed guide in which the guides for the I.C. components carried in the U-shaped carriers are adapted for ready removal and replacement so that the apparatus may be readily changed to accommodate the lead spacing of three, four and six tenths inches. The apparatus provided in this invention provides readily changeable center and lower guides and also readily changeable front and rear tube holders. This apparatus is provided with an infinitely speed-adjustable motor by which the leads of the I.C. component are straightened, bent (when required) and trimmed or cut.

In brief, this invention provides improved holding and accumulating of I.C. components stored, transported and after processing returned to U-shaped guide retainers. This invention provides improved and readily replaceable precision guides for I.C. components with four tenths inch and combined guides for three and six tenths inch spacing. The holders for the tubes are also easily changed to accommodate the spacing of the I.C. components. The speed for processing these I.C. components is provided by the infinitely variable-speed motor.

In addition to the above summary, the following disclosure is detailed to insure adequacy and aid in understanding of the invention. This disclosure, however, is not intended to cover each new inventive concept no matter how it may later be disguised by variations in form or additions of further improvements. For this reason there has been chosen a specific embodiment of the apparatus and method for shaping and trimming I.C. components as adopted for use with a U-shaped tube carrier and showing a preferred means for performing this operation at high speed. This specific embodiment and method has been chosen for the purposes of illustration and description as shown in the accompanying drawings wherein:

BRIEF DESCRIPTION OF THE DRAWINGS

FIGS. 6A, 6B and 6C represent top, side and end views of a front holder for a U-shaped tube for I.C's with a four tenth inch spacing, these FIGS. being for a holder which is used in place of the holder of FIGS. 4A, 4B and 4C;

FIGS. 7A, 7B and 7C represent top, side and end views of a rear holder for a U-shaped tube for I.C's having a four tenth inch spacing, these FIGS. being for a holder which is used in place of the holder of FIGS. 5A, 5B and 5C;

FIGS. 8A, 8B, 8C and 8D represent side, end and projection views plan and side of a spring clip for releaseably retaining both upper and lower U-shaped tubes to holders;

FIGS. 11A, 11B and 11C represent top, side and end views of a center guide for leads of an I.C. component with this guide adapted to accommodate leads with only a four tenths inch spacing;

FIGS. 12A, 12B and 12C represent top, side and end views of a lower guide adapted to accommodate leads of an I.C. component with only a four tenths inch spacing;

FIGS. 13A, 13B and 13C represent views of the processing dies as shown in U.S. Pat. No. 4,020,880. FIG. 13A representing a top view; FIG. 13B representing a side view, partly in section and FIG. 13C representing an isometric exploded view, partly diagrammatic of the reciprocated processing die assembly;

FIG. 14A represents a diagrammatic view from the front to the rear and showing the resiliently tired wheel in position to advance the I.C. component through the processing station. FIG. 14B represents a fragmentary prospective view of the resiliently tired wheel in an elevated non-advancing position, and FIG. 14C shows the apparatus of FIG. 14B but with the resiliently tired wheel in a lowered driving condition;

FIGS. 16A and 16B represent face and side views of a spring by which the roller arm is frictionally maintained in the selected position;

FIGS. 16C and 16D represent face and side views of a contoured cam used with the spring of FIGS. 16A and B to cooperate with the spring so as to maintain the roller arm in the selected position;

FIGS. 17A and 17B represent face and end views of the clutch arm lower end member;

FIGS. 17C and 17D represent face and end views of the shaft support for the lower shaft carrying the roller arm;

FIGS. 18, 18A and 18B represent side and end view of the clutch shaft, and

FIGS. 18C and 18D represent side and end views of the shaft carrying the feed wheel.

Figure 1:
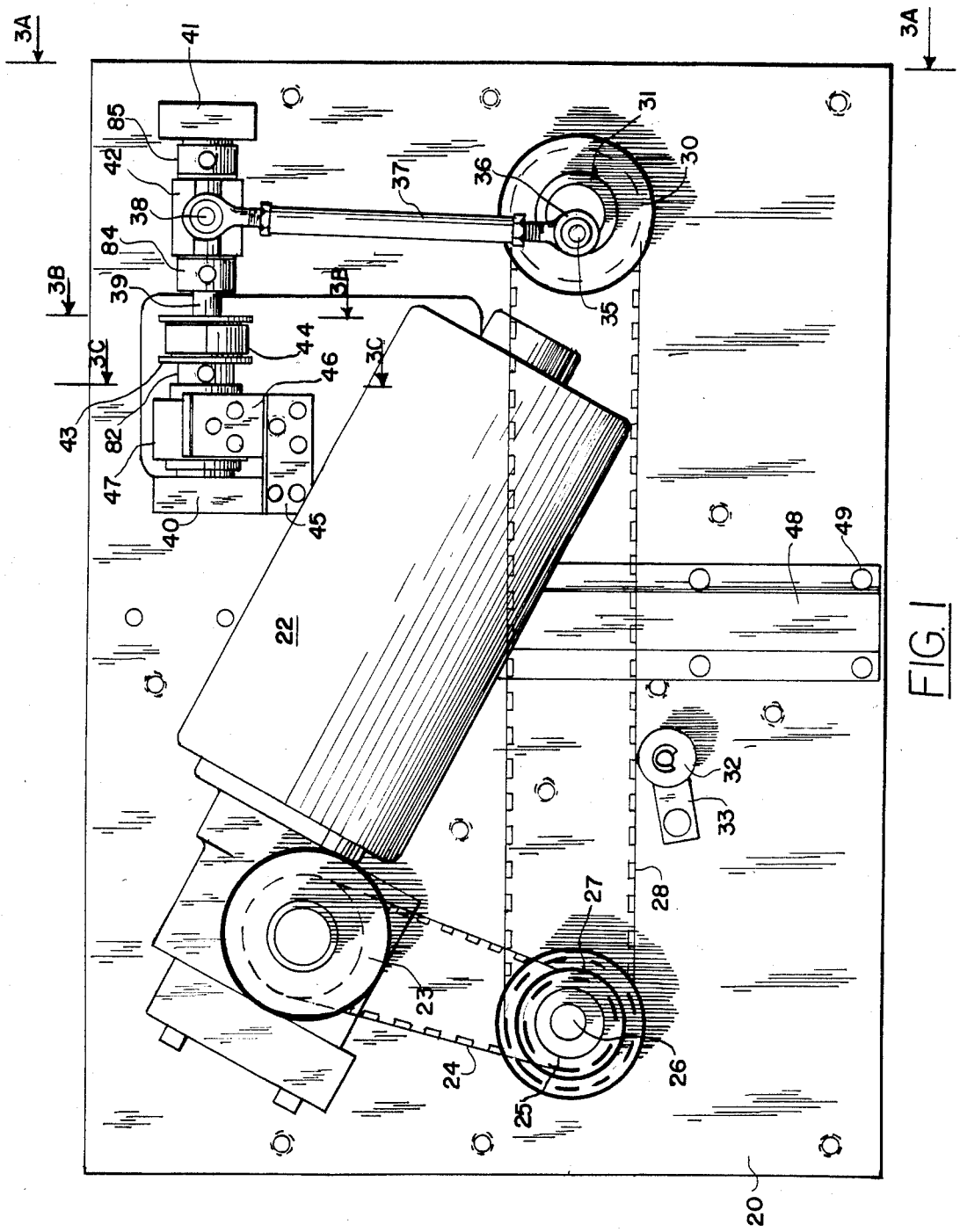
FIG. 1 represents a bottom view, partly diagrammatic, of the apparatus for processing the leads of I.C. components carried in a U-shaped retainer, this view partly fragmentary so as to illustrate the essential portions of the apparatus.
Figure 2:
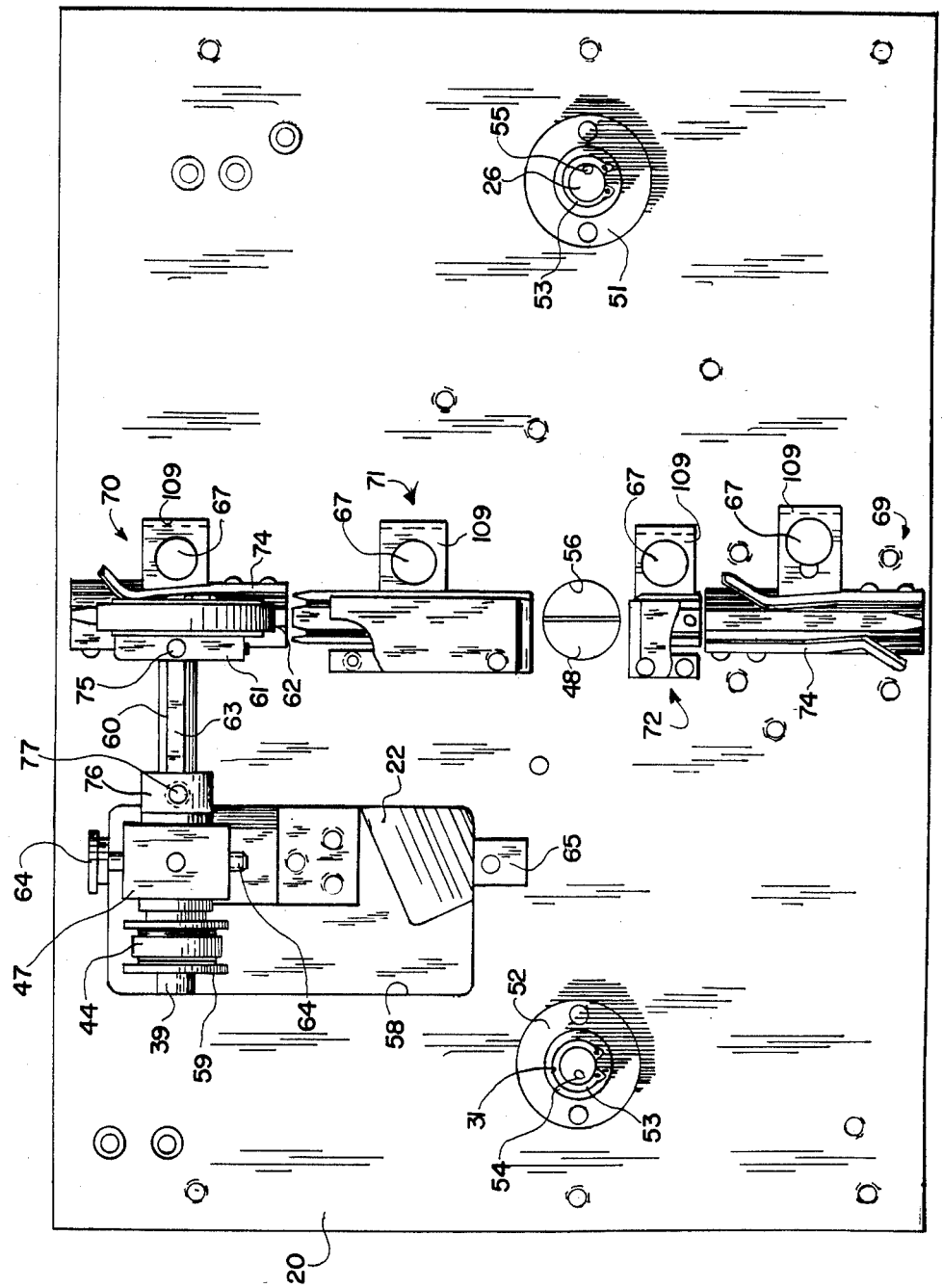
FIG. 2 represents a top or plan view of the apparatus of FIG. 1, also partly diagrammatic to show essential portions of the apparatus, this view in the same scale as FIG. 1.
Figure 3A:
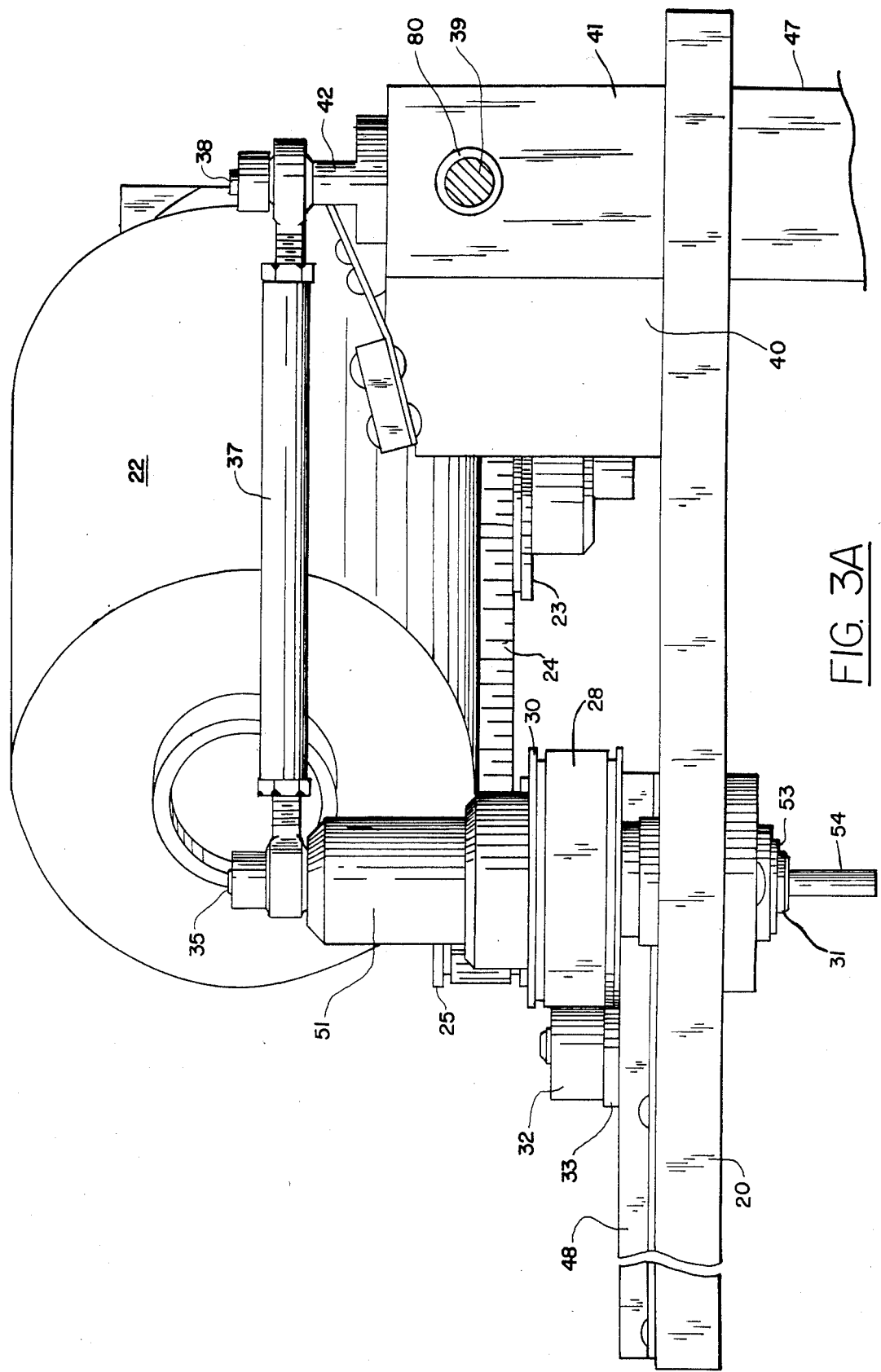
FIG. 3A represents a side view, partly diagrammatic, and in an enlarged scale of the apparatus shown in FIGS. 1 and 2, this view taken on the line 3A—3A of FIG. 1 and looking in the direction of the arrows.

EMBODIMENT OF FIGS. 1, 2 and 3A, B and C

It is to be noted that the apparatus as shown in FIG. 2 and in the other figures. that the near or bottom of the shown figure is designated as "front" and the opposite side as "rear". In other words, the inward feed of the I.C. components is from the "rear" to the "front" and with the "rear" elevated and sloping downwardly toward the "front". The trimmed ends of the I.C. components are collected and discharged in a chute or means below the apparatus.

The drawings and FIGS. 1, 2 and 3 in particular show the apparatus for trimming and/or shaping the leads of I.C. components as carried in and by U-shaped plastic retainers. As shown in FIG. 1, this apparatus includes a main plate 20 and mounted on the underside thereof is a motor 22. It is contemplated that this motor is an infinitely variable speed gear motor or gear connected motor with a pulley 23 driving a timing toothed belt 24 and a driven toothed pulley 25. On shaft 26 is carried a toothed pulley 27 which drives a toothed timing belt 28 and drives the timing belt pulley 30 carried on and by shaft 31. An idler 32 is carried by and on a pivotal arm 33 to adjust and maintain the tension desired in belt 28.

Figure 15A:
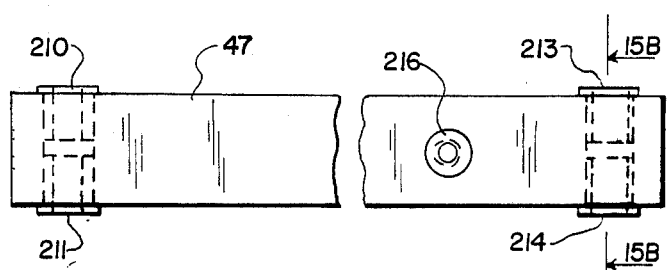
FIG. 15A represents a side view of the narrow dimension of the roller arm which carries the resilient tired wheel.
Figure 15B:
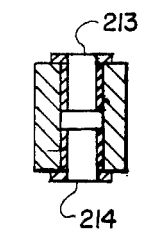
FIG. 15B represents a fragmentary sectional view taken on the line 15B—15B of FIG. 15A and looking in the direction of the arrows.

Shaft 31 has an eccentrically positioned pin or reduced shaft portion 35 which carries a connected end 36 of a Pitman arm or drag link 37. The other end of this arm 37 is connected to and actuates pin 38 adapted to reciprocate a shaft 39. This shaft is carried in bearing blocks 40 and 41 which are seen in FIGS. 17C and 17D which have anti-friction bearing means therein. These pressed-in-place bearings conventionally have flange faces to insure that adjacent collar members do not engage the facing surfaces of the supports. A clutch arm member generally identifend as 42 is shown more fully and in detail in FIGS. 17A and 17B and includes a pressed-in-place one-way clutch which allows the shaft 39 to be rotated clockwise as viewed in this FIG. 1. A toothed timing belt pully 43 is carried by and is moved when shaft 39 is rotated. This pulley moves belt 44 carried thereby. A spring mount plate 45 is secured to a sloped portion of bearing block 40 and at its other end carries a spring 46 secured thereto by screw means. This spring carries a cam shown in FIGS. 3A and 3C and in detail in FIGS. 16C and 16D. This spring and cam engages a roller arm 47 which is more fully shown in FIGS. 15A and 15B. Also seen in FIG. 1 is a discharge chute 48 attached by cap screws 49 to the plate 20.

In FIG. 2 there is depicted the top view of the apparatus as carried by the plate 20. Shafts 31 and 26 are carried in bearing supports 51 and 52 secured to the plate 20 by cap screws or the like. Shafts 31 and 26 are shown as retained in the desired position by snap rings 53. On shaft 31 is depicted a pin 54 which is eccentrically positioned to drive one side of the trimming and forming dies not shown in this FIG. At one hundred eighty degrees attitude from the pin 54 on shaft 31 is an eccentrically positioned pin 55 carried by shaft 26. The trimmed lead ends drop through a hole or aperture 56 in plate 20 onto chute 48.

Seen in an access cutout 58 is a portion of motor 22. This roller arm 47 is pivotally carried by shaft 39 and engages the rear extent of the access cutout 58 to provide its upward non-driving position and in this FIG. 2 is viewed from the top and as shown is in the "up" position which is disengaged from the advancing of the components carried in U-shaped carriers as in the reference patent. Timing belt 44 drives a timing belt pulley 59 which rotates feed wheel shaft 60 in the direction of the arrows. Looking from right to left, shaft 60 is caused to rotate in a clockwise direction. A hub 61 extends from a disk on which a resilient tire or band 62 is mounted and provides the feed wheel control. The one-way clutch mechanism is provided so that this feed wheel is rotated at the selected speed, direction and with intermittent timing. The shaft 60 has a flat 63 to allow the feed wheel to be selectively positioned to accomodate the several component lead widths to be processed. An adjusting thumb screw 64 is mounted in threads in roller arm 47. The small end of this adjusting screw 64 engages a plate 65 secured to the plate 20. This adjustment establishes the forward limit of the resilient feed wheel tire 62 as it engages the top surface of an advancing component.

Thumb screws 67 secure the several components to the plate 20. The I.C. components are conventionally provided in U-shaped plastic carriers and the forward portion of the carrier is positioned and retained in a rear holding station designated as 70. A front tubing holding station identified as 69 carries a U-shaped tube in which the now processed components are collected and transported to P.C. board use. At station 71 is provided a center guide and at station 72 is provided a lower guide. Both stations 69 and 70, in which the tube holder is removably retained, have spring clips 74 which are of spring steel and are hardened to Rockwell forty-five to fifty "C". To prevent rust problems these spring clips are plated as with nickel or the like. There are two spring clips at each station and each are disposed at one-hundred eighty degrees to each other. Means for securing these spring clips such as round head screws are contemplated.

It is to be noted that shaft 60 and flat 63 allows tired wheel disk 62 to be moved into a desired alignment by loosening and retightening set screw 75. In a like manner collar member 76 and screw 77 may be loosened and retightened to precisely align timing belt 44 and pulley 59 with the pulley 43 mounted on shaft 39 as in FIG. 1.

EMBODIMENT OF FIG. 3A

Figure 3C:
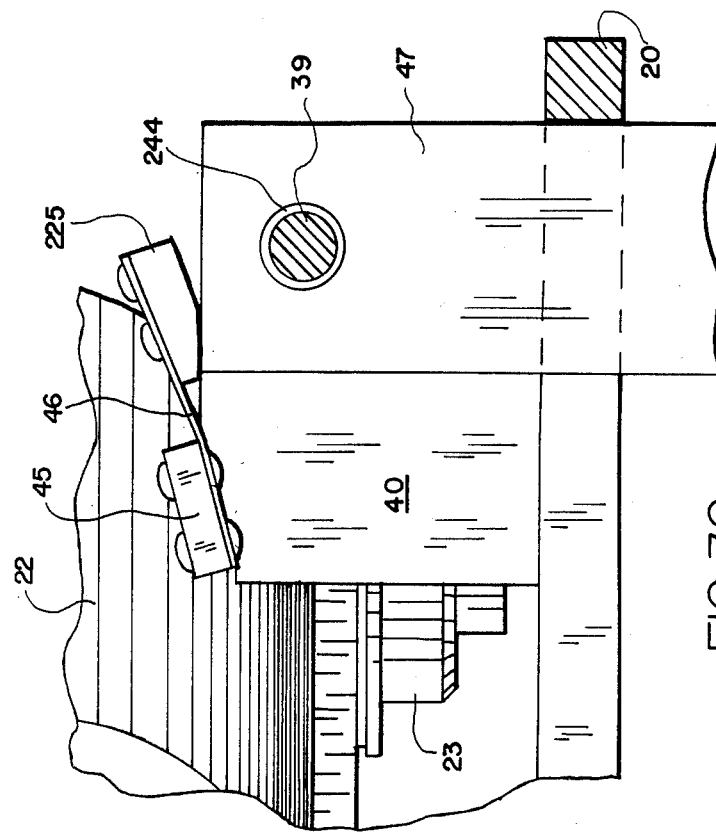
FIG. 3C respresnts a fragmentary side view very similar to that of FIG. 3A but inwardly from the eccentrically moved advancing drive and showing the apparatus by which a spring biased cam is employed to maintain the roller arm assembly in the desired condition, this view taken on the line 3C—3C of FIG. 1 and looking in the direction of the arrows.
Figure 3B:
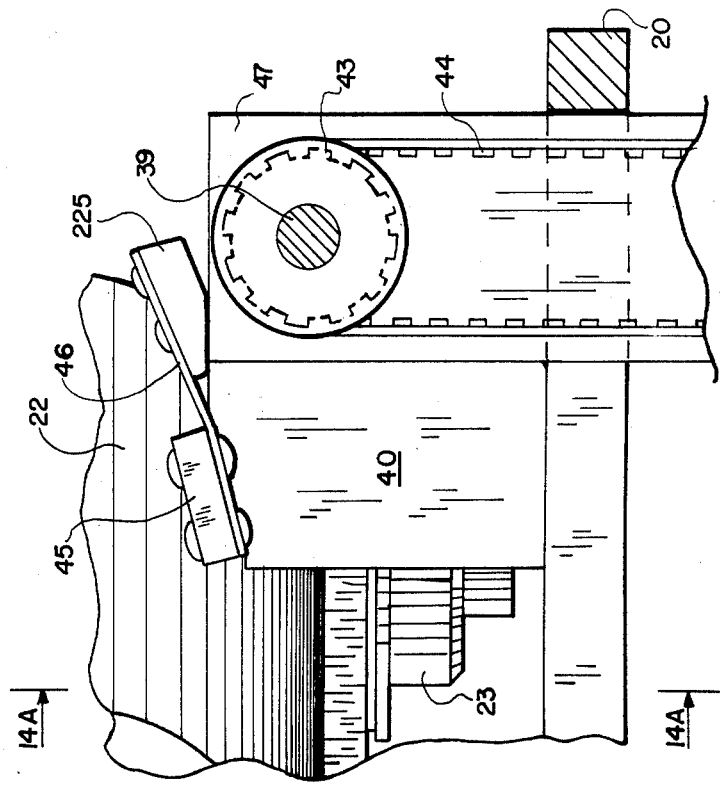
FIG. 3B represents a side view, partly fragmentary and diagrammatic and showing the relationship of the timing belt drive from the eccentrically moved clutch shaft and the feed wheel shaft which is driven by the timing belt pulley on the shown clutch shaft, this view taken on the line 3B—3B of FIG. 1 and looking in the direction of the arrows.

In FIGS. 3A, 3B and 3C it is to be noted that plate 20 is shown as substantially horizontal whereas in actual practice the plate is sloped at an angle that is at least thirty degrees so that the I.C. components are carried on their bodies lower surface from the rear and front holders and the guides and the processing station.

In FIG. 3A the apparatus is shown in enlarged scale. Motor 22 drives a timing belt system through belts 24, pulley 25, belt 28 and pulley 30. Also shown is idler 32 and arm 33. Shaft 31 and pin 35 is shown driving Pitman arm 37 which reciprocably moves the pin 38 in the clutch arm member 42 which is partially shown in this side view. Number 42 has its lower portion partially hidden by the near bearing block 41 in which shaft 39 is reciprocated. An oil-lite or like bearing identified as 80 is provided as a press fit in this bearing block 41. Also shown is belt 24 running from pulley 23. Chute 48 and bearing block 40 are also seen. Shaft 26 is also indicated as rotatably carried in bearing support 51. Shown in this view is the roler arm 47 as it extends below the plate 20. The Pitman arm 37 is provided with the conventional rod ends which usually include spherical bearing or seating means to provide automatic alignment.

EMBODIMENT OF FIG. 3B

In FIG. 3B this side view is partly fragmentary to show the relationship of the timing belt pulley 43 as it is mounted on the clutch shaft 39. This pulley is secured to this shaft by a set screw 82 in an extending hub of this pulley. This pulley drives belt 44 which mates with pulley 59 seen in FIG. 2. Shaft 39 is seen in section and collar members 84 and 85 (FIG. 1) secure and position this shaft. Bearing block and shaft support 41 is shown as well as cam 225 which is secured to spring plate 46 by cap screws 87.

EMBODIMENT OF FIG. 3C

In FIG. 3C this side view is partly fragmentary and in particular shows the relationship of the roller arm 47, the cam 225 and the shaft 39 and shaft support 41. In the upright condition as in FIG. 1, the roller arm 47 is frictionally retained by spring biased cam 225. Excessive movement of this arm is limited by the cutout 58 which provides a rearward limit to the swing of the arm 47. Forward limit is adjusted by rotated screw 64 as its front or forward end engages plate 65. Support 41 is beveled at its extending portion to provide a support surface for mounting plate 45.

Figure 4A:
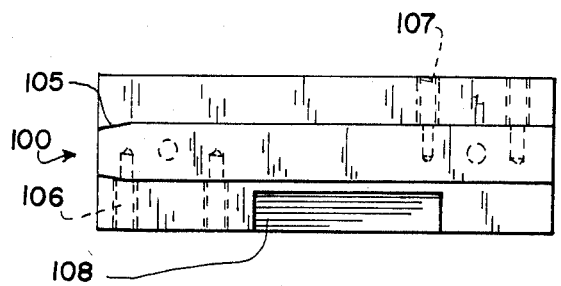
FIGS. 4A, 4B and 4C represent top, side and end views of a front holder (discharge end) for a U-shaped tube holder for I.C. components having six tenths of an inch spacing of leads and after processing has been achieved.
Figure 4C:
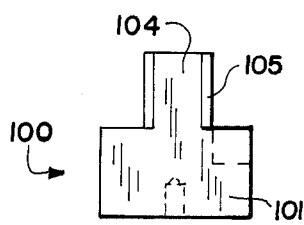
Figure 4B:
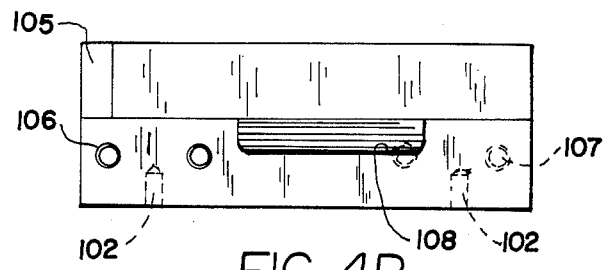

EMBODIMENT OF FIGS. 4A, 4B and 4C

Referring to FIG. 2 and the station generally identified as 69, this station includes a front tube holder sized to accept the U-shaped tube and I.C. components therein. A holder 100 is made of metal such as aluminium and has a determined width and length to provide a rectangular base 101. Drilled and reamed holes 102 are provided for locating dowels not shown. A top guide portion 104 is sized to slideably guide the leads of the processed I.C. component to be accommodated. As shown, this holder is for a six tenth inch component and the upwardly extending portion is contemplated to be about forty-two hundredths of an inch wide and forty-nine hundredths inches high and three inches in length. As seen a taper 105 is provided. On the near side (FIG. 4B) two tapped blind holes 106 are provided and like or similar blind threaded holes 107 are provided on the opposite side. These holes 106 and 107 are for spring clips 74. A recess cutout 108 is formed on the near side (FIG. 4B) to provide a shoulder for a removable clamp plate 109 which is loosened and tightened by the thumb screw 67. This cutout is about one and a quarter inch long and three-sixteenth deep and about the same extent inward as that provided for the forming of the guide portion 104.

Figure 5A:
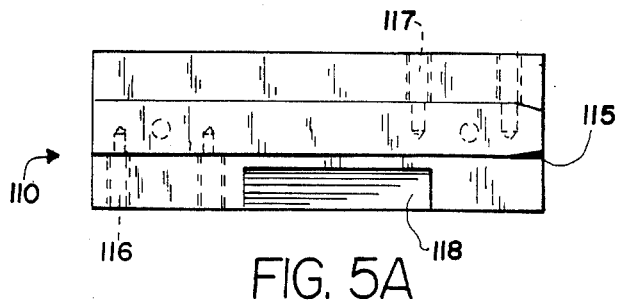
FIGS. 5A, 5B and 5C represent top, side and end views of a U-shaped tube rear holder very much like the holder of FIGS. 4A, 4B and 4C but for the U-shaped holder and I.C. components before they are processed, this holder also for six tenths inch spacing of leads.
Figure 5C:
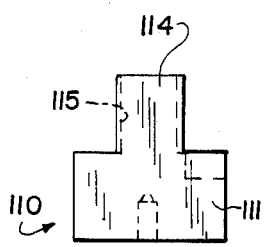
Figure 5B:
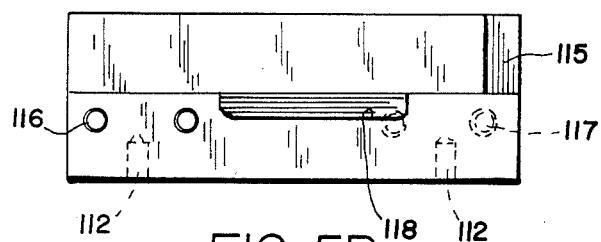

EMBODIMENT OF FIGS. 5A, 5B and 5C

Still referring to FIG. 2, it is to be noted that at station 70 there is provided a rear tube holder sized to accept the U-shaped tube into which the to be trimmed and shaped I.C. components are accumulated and now ready for advancing to dies as cycled by this apparatus. This rear tube holder is very like the forward holder 100 shown in FIGS. 4A, 4B and 4C but the taper is towards the edge so as to provide a guide for advancing and retaining a U-shaped tube carrier and untrimmed and shaped components. The rear holder includes a general identification of 110 and is made of metal such as aluminium and has a determined width and length to provide a rectangular base 111. Drilled and reamed holes 112 are provided for locating dowels not shown. A top guide portion 114 is sized to slideably guide the leads of the I.C. component to be accommodated. As shown, this holder is for a six tenth inch component and the upwardly extending portion is contemplated to be about forty-two hundredths of an inch wide and forty-nine hundredths of an inch high and three inches in length. As seen, a lead-in taper 115 is provided. On the near side (FIG. 5B) two tapped blind holes 116 are provided and like blind or shoulder threaded holes 117 are provided on the opposite side. These holes 116 and 117 provide means for screws to retain spring clips 74. A recess cutout 118 is formed on the rear side (FIG. 5B) to provide a shoulder for a clamp 109 which is tightened and loosened by the thumb screw 67. This cutout is about one and a quarter inch long and three-sixteenths deep and about the same extent inward as that provided for the forming of the guide portion 114.

EMBODIMENT OF FIGS. 6A, 6B and 6C

Still referring to FIG. 2 and station 69, it is to be noted that this front station guide is easily changed to accommodate the I.C. component to be carried in the U-shaped carrier. This showing is very similar to FIGS. 4A, 4B and 4C but is for four tenths components. A holder 120 is made of metal such as aluminium and has a determined width and length to provide a rectangular base 121. Drilled and reamed holes 122 are provided for locating dowels not shown. A top guide portion 124 is sized to slideably guide the leads of the processed I.C. components to be accommodated. As shown, this holder is for a four tenth inch component and the upwardly extending portion is contemplated to be about twenty-three hundredths of an inch wide and forthy-nine hundredths inches high and three inches in length. As seen, taper 125 is provided. On the near side (FIG. 6B) two tapped blind holes 126 are provided and like or similar threaded holes 127 are provided on the opposite side. These holes 126 and 127 are for spring clips 74. A recess cutout 128 is formed on the near side (FIG. 6B) to provide a shoulder for a clamp 109 which is tightened and loosened by the thumb screw 67. This cutout is about one and a quarter inch long and three-sixteenths deep and about one eighth inches in from the edge.

EMBODIMENT OF FIGS. 7A, 7B and 7C

Still referring to FIG. 2 and station 70 it is to be noted that this front station guide is easily changed to accommodate the I.C. component to be carried in the U-shaped carrier. This showing is very similar to FIGS. 5A, 5B and 5C but is for four tenths components. A front and rear holder for U-shaped tubes and components are provided for stations 69 and 70, and these holders are similar to those depicted in FIGS. 6A, 6B, 6C, 7A, 7B and 7C but for the width of the extending tongue in which the width is about fifteen-hundredths of an inch and the height is forty-nine hundredths of an inch. These and all of the front and rear tube holders are provided with an opposed pair of spring clips 74 and by means of thumb screws 67 and clamp plates 109 these holders are removably retained in the desired position.

A holder 130 is made of metal such as aluminum and has a determined width and length to provide a rectangular base 131. Drilled and reamed holes 132 are provided for locating dowels not shown. A top guide portion 134 is sized to slideably guide the leads of the to be processed I.C. component to be accommodated. As shown, this holder is for a three tenth inch component and the upwardly extending portion is contemplated to be about twenty-three hundredths of an inch wide and forty-nine hundredths inches high and three inches in length. As seen, a lead-in taper 135 is provided. On the rear side (FIG. 7B) two tapped blind holes 136 are provided and like or similar blind threaded holes 137 are provided on the opposite side. These holes 136 and 137 are for spring clips 74. A recess cutout 138 is formed on the near side (FIG. 7B) to provide a shoulder for a clamp 109 which is tightened and loosened by the thumb screw 67. This cutout is about one and a quarter inch long and three-sixteenths deep and about one-eighth inch from the edge.

SPRING CLIP OF FIGS. 8A, 8B, 8C and 8D

The spring clip 74 used to hold the U-shaped plastic tube carriers is conventionally made of spring steel heat treated to a spring temper and plated to inhibit rust and discoloration by atmospheric factors and the like. As depicted, in substantially full scale, the view FIG. 8A shows the clip in a side view with a retaining tab portion 140 into which are formed through holes 141 and 142 providing means for passing screws to a tube holder. As seen in FIG. 8B a retaining portion identified as 144 is canted about twelve degrees from the tab portion 140. This leftwardly extending portion as seen in FIG. 8A is bent in two directions. As seen in FIG. 8D, an intermediate portion 146 is bent from the plane of the securing tab portion 140 and at its end the clip is bent at 147 to form an included angle. The bend of portion 146 from the base portion is about six to seven degrees and the bent end 147 is about three eighths inches and with a bend of about thirty degrees from the tab portion 140. These bends are made with a controlled radius to prevent metal fatigue. The spring clip as reduced-to-practice is of spring steel of about twenty-two gauge.

EMBODIMENT OF FIGS. 9A, 9B, 9C and 9D

Referring still to FIG. 2, station 72 depicts a center guide portion. In FIGS. 9A, 9B, 9C and 9D there is shown in substantially full scale the guide for both the six tenths and the three tenths inch spaced I.C. components. It is to be noted that this guide is used for both the three and six tenths spacing of leads without removal from the apparatus and stations. A metal guide of plated steel is depicted and includes a rectangular member 150 have a seating surface 151 into which there is formed two reamed blind holes 152 and 153 for dowel guide pins not shown. A retaining groove 154 is formed in one side for the insertion of the end of a clamp 109. This groove is one quarter inch wide and about one eighth inches deep and the length is about one and one quarter inches long.

This rectangular member is five eighths inches thick and the outer surfaces are finished as by grinding to present sliding surfaces for the leads of the component. Grooves 156 and 157 are formed in the top surface. These grooves are nominally five sixty-fourth inches from the outer surface and are the same distance in from the outer edges. These grooves are slightly deeper than thirteen sixty-fourth inches deep. A tapered guide inlet is provided for each groove. This taper identified as 158 is about ten degrees. The outer end of this guide is also tapered at 159 to guide the wire leads for a component of six tenths inch.

Figure 9A:
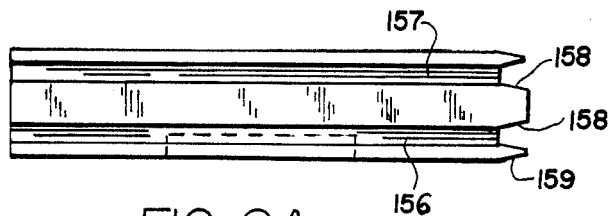
FIGS. 9A, 9B, 9C and 9D represent top, side, bottom and end views of a center guide for the leads of an I.C. component with this guide adapted to accept leads with both a three or a six tenths inch spacing.
Figure 9B:
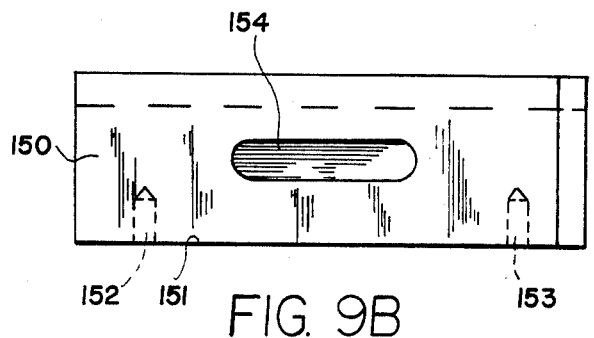
Figure 9D:
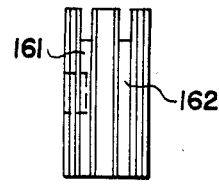
Figure 9C:
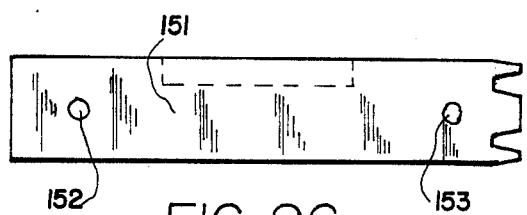

In FIGS. 9A, 9C and 9D the front face of this member 150 is shown with beveled slots 161 and 161 across the face extent but this is merely a matter of manufacturing convenience and is not required as long as the lead-in taper to grooves 156 and 157 is provided. The upwardly extending portions forming grooves 156 and 157 are radiused and polished so as to reduce any possibility of slowing the gravitional progress of the components and their wire leads through this guide.

EMBODIMENT OF FIGS. 10A, 10B, 10C and 10D

Figure 10A:
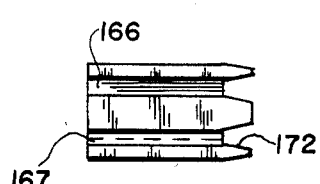
FIGS. 10A, 10B, 10C and 10D represent top, side, bottom and end views of a lower guide for the leads of an I.C. component with this guide adapted to accept leads with both a three or a six tenths inch spacing.

Referring next to FIGS. 10A, B, C and D, a lower guide block 165 is made with grooves 166 and 167 of the same spacing and depth as grooves 156 and 157 of FIG. 9A. Rather than a clamp groove with closed ends as groove 154 shown in FIG. 9B, this guide has a groove 168 which is one eighth inch deep and one quarter inch wide and full length. This block is about ninety-one hundredths inches long and as in FIG. 9B is the same height and width as FIGS. 9A, B, C and D. This block is also located by means of blind holes 169 and 170 adapted to engage dowels not shown. Tapers 172 are formed at the leading ends of grooves 166 and 167. This lower guide for both the six tenths and three tenths inches spaced leads is used at station 71. As in the guides above, the lower guide is removable to accommodate the particular I.C. component to be processed.

EMBODIMENT OF FIGS. 11A, 11B and 11C

In FIGS. 11A, B and C there is depicted a center guide 180 used with four tenths inches I.C. components and used at station 72. This guide includes a block 181 from one half inch steel stock and finished to one and three sixteenths high and finished on both top and bottom surfaces. This guide as in the guide for FIG. 9A is also three and about twenty-seven sixty-fourths inches long. Rather than a groove for the clamp member 109 there is provided a shoulder 182 which is about seven sixteenth inches above the base surface. Two blind and reamed holes 183 and 184 are provided for dowel locators. These holes are two and three quarters inches apart.

The guide member 180 is thirty-five hundredths inches thick at its upstanding portion 185. Both sides are finished so as to provide minimum friction to the gravitionally advanced component leads. A taper 186 of about ten degrees and about three hundredths extent at the forward end is provided so that the leads are guided by the portion 185 to the trimming and shaping dies. The guide is plated to prevent rust and/or discoloration by the environment.

EMBODIMENT OF FIGS. 12A, 12B and 12C

In FIGS. 12A, B and C at station 71 there is depicted a lower guide 190 which is about twenty-nine thirty-seconds inches long. This guide is also for four-tenths inch I.C. components. As in the center guide of FIGS. 11A, B and C a steel member 191 is formed from one-half inch by one and a quarter inch stock. The shoulder 192 is seven-sixteenths inches above the finished base and the guide member 193 is thirty-five hundredths inches thick. Blind and reamed holes 194 and 195 are adapted for dowel locators not shown. Taper portions 196 are formed to assist in guiding the leads of the components to and along this guide member. As above, said lower guide of this embodiment is plated to protect this member against the environment. It is to be noted that at station 71 (front) the guides depicted in FIGS. 10A, 10B, 10C, 10D, 12A, 12B and 12C are carried beneath a retaining plate 198. This plate is secured so that the processed I.C. components slide therebelow. In a like manner at station 72 (center) the guides depicted in FIGS. 9A, 9B, 9C, 9D, 12A, 12B and 12C are carried beneath a retaining plate 199. As seen in FIG. 2 the removal of the thumb screws 67 and the clamps 109 enables the guides to be changed to suit the component being processed.

PROCESSING STATION OF FIGS. 13A, 13B and 13C

As seen in FIGS. 13A, B and C, there is depicted processing dies for the I.C. components carried in the U-shaped plastic containers. These dies are generally shown and explained in detail in FIGS. 4, 5 and 6 of U.S. Pat. No. 4,020,880 above referenced. As seen in FIG. 2 of this application the shafts 26 and 31 have the drive pins or posts 54 and 55 which actuate link arm members 201 and reciprocated die members 202. A support block 203 is removably carried by plate 20 and the trimmed ends of the leads fall through aperture 56 to the chute 48 below. In all other respects the die shaping and trimming is as noted in the reference patent.

Figure 14A:
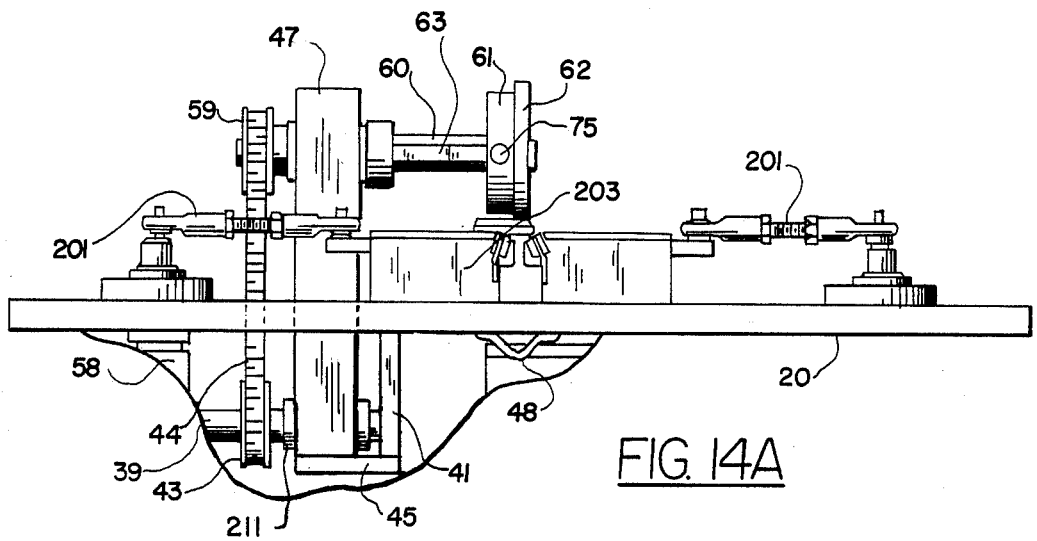
FIGS. 14A, 14B and 14C represent views of the resiliently tired wheel as used to advance the I.C. components.
Figure 14B:
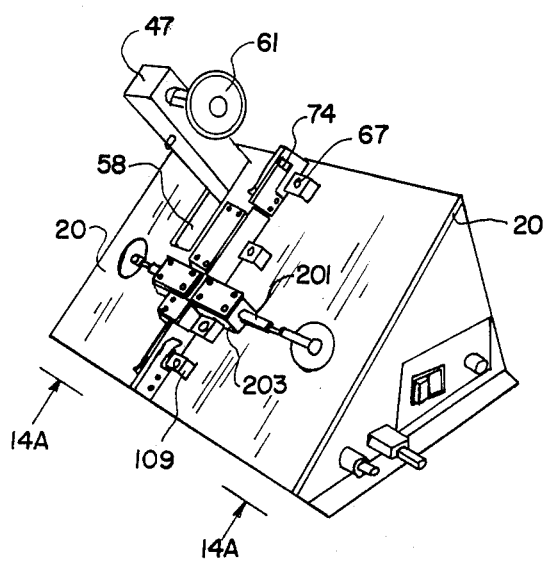
Figure 14C:
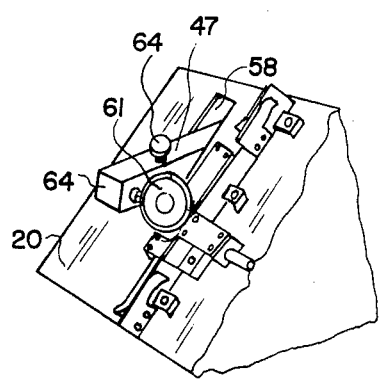

EMBODIMENT OF FIGS. 14A, 14B and 14C

In FIG. 14A is shown the relationship of the dies to the resiliently tired feed wheel mechanism. This showing depicts the feed wheel 61 and its resilient tire 62 in driving engagement with an I.C. component. Of particular note is that timing belt 44 is driven by pulley 43 mounted on shaft 39. The driven pulley 59 is rotatably carried by roller arm 47 and shaft 60. The flat 63 on shaft 60 allows wheel 61 to be adjusted to suit a component by tightening and loosening set screw 75 in the hub portion of said disk. The relationship of the support block 203 and the discharge chute 48 to opening 58 is also shown.

In FIG. 14B a fragmentary showing in a reduced scale shows the arm 47 is a raised condition. The feed wheel 61 is in the raised condition of FIG. 14A. The relationship of spring clip 74, thumb screws 67 to the assembly is also shown.

In FIG. 14C the fragmentary view of FIG. 14B is repeated but with the arm 47 moved to a drive condition whereby feed wheel 61 is lowered into position to feed the I.C. components to and through the die station. Thumb screw 64 is rotated to provide the desired adjustment of the feed wheel.

EMBODIMENT OF FIGS. 15A AND 15B

The narrow side of roller arm 47 is shown. This view is shortened by broken portions for the convenience of illustration. As reduced-to-practice, the arm is of aluminum bar stock one inch thick and one and one-half inch wide. This arm is about eight and three-quarters inches long. As this arm is pivotally swung about shaft 39 the arm has two flanged bearing or bushings 210 and 211. These bearings are reamed for a rotating capability of the shaft 39. The upper end of this arm also has two inserted flanged bushings 213 and 214 which are reamed for a rotating fit of shaft 60. About two and one-half inches from the center line of the upper bushings 213 and 214 is an insert 216 which is threaded to accept and retain the threaded shank of thumb screw 64. As reduced-to-practice this insert is of steel and has an internal thread of one-quarter inch and twenty threads.

EMBODIMENTS OF FIGS. 16A THROUGH 16F

In FIGS. 16A and 16B the leaf spring generally identified as 46 seen in FIGS. 1 and 3 is shown in detail. As depicted, this spring is of flat spring steel about forty thousandths inch thick. This spring is of one inch wide stock and is two and five sixteenths inches long. Holes 220 and 221 are arranged in a staggered pattern of three holes each for the passing therethrough of the shanks of eight-thirty-two cap screws. This spring steel is tempered and plated as is the spring in FIGS. 8A, 8B, 8C and 8D.

In FIGS. 16C and 16D a cam block 225 is carried and is secured to the spring 46. The placement of this cam is shown in FIG. 3 and a base support surface 226 is attached to the flat surface of the spring 46. A contoured or curved surface 227 is disposed opposite the support surface 226 and as shown is with about a two inch radius. A pattern of three holes is shown and are identified as 228. These holes are threaded or tapped for eight-thirty-two threads for cap screws attachment to spring 46. This cam is contemplated to be of aluminum and finished with a glass bead surface treatment.

Figure 16E:
FIGS. 16E and 16F represent a face and side view of the spring mount member by which the spring of FIGS. 16A and B are retained.
Figure 10B:
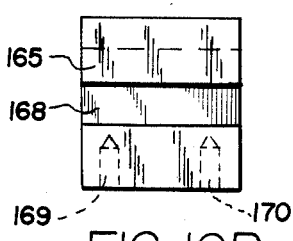
Figure 10D:
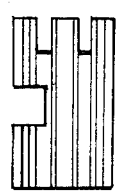
Figure 16F:
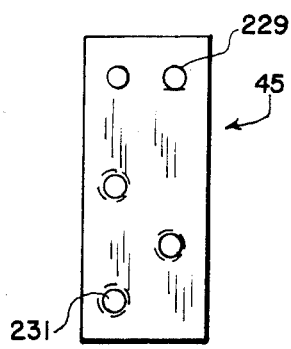
Figure 10C:

Referring next to FIGS. 16E and 16F there is depicted a spring mount 45 which is made of aluminum and is about one-quarter inch thick. The plan dimensions is about seven-eighths inch wide and one and three-quarters inches long. Two through holes 229 are provided for attaching this mount to the shaft support 41. Also shown are three threaded holes 231 which are used with cap screws to attach the spring member 46 of FIGS. 16A and 16B above.

EMBODIMENT OF FIGS. 17A AND 17B

In FIGS. 17A and 17B there is shown the clutch arm member shown in FIG. 1 and in FIG. 3A and generally identified as 42. A pin 38 is inserted into member 42 and conventionally is a hardened dowel pin that is three-sixteenth inch diameter and one inch in length. This pin is press fitted into a drilled hole in the upstanding portion of said member. A through hole 234 is a press fit for a one-way clutch mechanism 236.

EMBODIMENT OF FIGS. 17C AND 17D

In FIGS. 17C and 17D is shown the shaft support member (bearing blocks) generally identified as 40. This support is of aluminum about one-half inch in thickness and from two inch wide stock about two and five-eighths inches long. A slope or bevel 239 is formed at one corner and into this formed slope is drilled and tapped two, eight-thirty-two holes 240 and 241 for cap screws by which the spring mount 45 is secured to this shaft support member. The lower shaft 39 is carried in a bushing 244 which is pressed in place and reamed for rotating movement in this bearing.

EMBODIMENT OF FIGS. 18A AND 18B

In FIGS. 18A and 18B there are shown the side and end views of the lower shaft 39. It is to be noted that a small countersink 250 of about one-sixteenth diameter is formed with a ninety degree countersink and provides a precise location for the set screw 82 in pulley 43. (FIG. 1) This shaft is made from ground shafting generally three eighths inches in diameter.

EMBODIMENT OF FIGS. 18C AND 18D

Referring next and finally to FIGS. 18C and 18D, there is shown a side and end view of the feed wheel shaft generally identified as 60. This shaft is nominally one-half inch ground shafting and about five inches long. A shallow groove or flat 63 is provided and allows the feed wheel to be adjustably positioned by loosening and tightening set screw 75 (FIG. 2). This groove allows the set screw to be used many times without destroying the capability and straightness of the shaft.

USE AND OPERATION

The motor 22 through the reducer and controls produces the desired rotational speed of shafts 26 and 31. This rotation translates into moving eccentric pins 54 and 55. It is to be noted that shaft 31 also move Pitman arm 37 and therewith a positively timed actuation is provided. This Pitman arm is cycled back and forth by the orbital positioning and movement on the rotated shaft 31. The clutch arm member 42 is moved back and forth (cycled) in response to this movement of pin 38. This member is shown in FIGS. 17A and B and carries the one-way clutch 236 so that shaft 39 is moved in only one direction and with small and like increments. This rotational movement when translated to the resilient tire 62 provides the controlled and precise feed of a DIP component forwardly. This feed wheel and resilient tire insures a metered feed of a precise rotational amount and speed.

The timing belt 24 from drive timing belt pulley 23 to pulley 25 causes shaft 26 to be rotated. The belt 28 also moves and rotates shaft 31 which on the above side of plate 20 causes the eccentrically positioned pins 54 and 55 to move the reciprocated dies shown in FIGS. 13A, B and C. These dies are replaceable and are particularly made for the particular leads to be processed. It is to be noted that motor 22 has enough capacity to drive a tandem operation whereat the one system can and does process leads so as to be bent or formed in a selected configuration. In an associate or tandem operation process the same component is trimmed as to lead length.

This apparatus provides easily removable front and rear holders at stations 69 and 70. The clamps 109 are tightened and loosened by manipulation of thumb screws 67. Standard input and output tube holders are contemplated to be used with this apparatus but modifications may be made to suit special sizes. The processing of these leads is contemplated to be up to two hundred fifty thousand leads per hour. The dies are contemplated to either trim (cut to a desired length) or to bend and shape to conform to desired application pattern.

This shown embodiment pertains to the presently most popular dual in-line components having spacings of three, four and six tenths of an inch, but special holders and guides may be provided without the need of radical change in the processing apparatus. The provision of ready removal of front and rear holders, guide portions (center and lower) and processing dies permits ready change of the basic apparatus to accommodate sizes other than three, four and six tenths inches.

The depicted apparatus also provides a basis for method operation and includes the steps of providing a variable speed motor carried by a base plate, and rotating a pair of shafts carried by said base plate by drive means associated with said motor; carrying and moving a Pitman arm by said drive means and programming a first end of the Pitman arm so as to move in an orbital path around the axis of one of the shafts and attaching the other end of said Pitman arm to and reciprocably moving a clutch housing carried by a rotatable clutch shaft; mounting a one-way clutch in said clutch housing so as to rotate said clutch shaft in like incremental arc-like movements and in only a determined one-way direction and carrying said clutch shaft below said base plate; securing and mounting a pivotally swung feed wheel arm on said clutch shaft so that said arm is movable in an arc around said clutch shaft; rotatably carrying a feed wheel shaft at the other end of said pivotally swung arm, and at one portion of said feed wheel shaft carrying a selectively positioned feed wheel on which is mounted a resilient tire; operatively connecting by belt means so as to move the feed wheel shaft as the clutch shaft is moved and rotating the feed wheel shaft in like arc increments as the clutch shaft is rotated, the resilient tire on the feed wheel when brought into driving engagement with a body of an IC component providing advancing and metering means; removably securing to the base plate an upper (rear) tube holder, said holder adapted to receive and deliver IC components having like center spacing between leads, and disposing said holder so that in mounted condition IC components are delivered by gravity to the resilient tire on the feed wheel; providing and removably securing to the base plate and between the tube holder and tire of the feed wheel a slide guide by which the IC components are gravitationally delivered to a processing station; removably securing to said base plate a pair of die means with one of the die means disposed on one side of the feed wheel tire and the other die means disposed on the other side, each of said die means reciprocably moved by an arm operatively connected to the die means and moved by one of the shafts carried by said base plate; providing and removably securing to the base plate and subsequent to the die means a lower slide guide adapted to receive the processed IC component, and removably securing to the base plate a lower tube holder (front), said holder adapted to receive an IC carrier with the processed IC components still retaining their determined lead length and spacing.

It is to be noted that the above described apparatus can process IC components with three, four and six tenths lead centers. The dual in-line IC components usually have eight or more leads each. The above apparatus is contemplated to automatically process leads at up to 250,000 leads per hour. This rate is more than most operators can use. This same apparatus can be adapted to process other lead spacings such as nine-tenths inches. In the above described apparatus a simple changing of the dies enables the leads of the components to be cut to any desired length, reformed inwardly or outwardly or even formed with stand-off or snap-in dimples. Automatic IC insertion machines may be serviced with and by the IC components produced.

Dies are provided for length of leads, for shaping or for combinations thereof and the change can be achieved in a very short period of time since the dies of FIGS. 13A through 13C are removed from the base plate 20 as a unit and on the cycled arms 201 used therewith are easily mounted in place. The lead processing (cutting and/or forming) is achieved with no relative motion between the IC components and the dies. Tolerances are held and are precise. This method and apparatus may be somewhat more costly than roller forming and cutting but no unwanted distortion is present and no damaging stress to the seals of the IC is produced with the above described apparatus.

Terms such as "left", "right", "up", "down", "bottom", "top", "front", "back", "in", "out", "clockwise", "counterclockwise" and the like are applicable to the embodiment shown and described in conjunction with the drawings. These terms are merely for the purposes of description and do not necessarily apply to the position in which the apparatus for shaping and cutting (DIP) IC components may be constructed or used.

While a particular embodiment of the apparatus and removable guides and retainers has been shown and described it is to be understood the invention is not limited thereto and protection is sought to the broadest extent the prior art allows.

What is claimed is:

1. Apparatus for processing the leads of dual in-line IC components which includes gravitational feeding of said components from a carrier to a processing station, this gravitational feeding along a path disposed at a slope of at least thirty degrees to the horizontal whereat processing of the leads is performed and after which by gravity these now processed components are fed to an accumulation carrier, said apparatus including:
   (a) a base plate in operation disposed at a slope of at least thirty degrees and providing above and below areas;
   (b) a variable speed motor carried by said base plate and a pair of driven shafts rotatably mounted so as to be substantially normal to said base plate and rotated by drive means also carried by said base plate;
   (c) a Pitman arm connected to one of said pair of driven shafts and moved by said drive means and programmed to move a first end in a circular orbital path around an axis of a driven shaft and with the other end of said Pitman arm operably connected to a clutch housing which is moved in a reciprocated manner, said clutch housing operably mounted on a clutch shaft rotatably carried in bearings attached to said base plate;
   (d) a one-way clutch carried in and by said clutch housing, this clutch carrying and adapted to rotate said clutch shaft in substantially identical incremental movements and in only a selected direction;
   (e) means for rotatably carrying said clutch shaft in a below area of said base plate;
   (f) a pivotally mounted feed wheel arm fixedly secured to said clutch shaft and swingably movable around said clutch shaft;
   (g) a feed wheel shaft rotatably carried by said pivotally movable arm, said feed wheel shaft disposed in and at the swingable end of the arm, with this shaft carrying a feed wheel on which is a resilient tire attached to the periphery of said feed wheel, said feed wheel and the attached resilient tire having means to selectively position and secure said feed wheel along said feed wheel shaft;
   (h) belt means operatively connected to the clutch shaft and feed wheel shaft and having means for positively rotating said feed wheel in like selected increments, speed and direction so that the resilient tire of the feed wheel when brought into driving engagement with the bodies of the IC components engages only a top portion of the component body to provide a positive advancing and metering means;
   (i) a first tube holder which is replaceably and removably carried by the base plate, said holder when secured to the base plate in a position and condition adapted to receive an IC carrier in which the components have like determined center spacing between leads, said first tube holder disposed so that in secured mounted condition like IC components are delivered by gravity to subsequent operations;

(j) a removable infeed slide guide adapted to receive said IC components from a holding carrier and feed said components gravitationally to subsequent operations;

(k) a processing station including die means and means for retaining an IC component in a held-in-place position, said die means including die guide and retaining means removably secured to the above area of the base plate;

(l) a pair of opposed arms each operatively connected to the die means in the processing station and reciprocably moved in said guide and retaining means, each die means moved by one of said shafts and drive means and in timed relationship to the intermittent rotation of the resilient tire on the feed wheel, each arm and connected die means disposed to move to and from said held-in-position IC component;

(m) a removable lower slide guide adapted to receive the processed IC component, this guide carried by the base plate, and (n) a second tube holder which is removably carried by the base plate, said holder adapted to receive an IC carrier with the processed IC components still retaining their determined lead spacing and length.

2. Apparatus for processing IC components as in claim 1 in which the processing station provides for the cutting of the leads to a determined length of each IC component, said cutting provided by like cutter bars each of which is slideably carried in a slot formed in a guide support carried by the base, said slot covered by a guide plate secured to the guide support, the cutter bars being urged to and against the guide plate with the top surface of the bars establishing a cutting line of the leads and a cutting die formed as a slide guide and carried by the base, the undersurface of the cutting die cooperating with the cutter bars to shear the leads of an IC component when advanced and held by the resilient wheel during a reciprocated movement of the cutter bars.

3. Apparatus for processing IC components as in claim 1 in which the pivotal feed wheel arm carries an adjustable limiting screw by which the resilient tire is positioned as to its engaging contact of the body of an IC component to provide the desired drive and a metering capability.

4. Apparatus for processing IC components as in claim 1 in which each upper and each lower tube holder has spring means along each side extent to provide a desired gripping and release of a holder length.

5. Apparatus for processing IC components as in claim 4 in which each spring means on the holder is a leaf spring of heat treated spring steel and having a cant to provide an easy entryway and secured at one end to provide a spring finger portion which is deflected by the insertion of and presence of a tube holder and there is a pair of springs on each holder.

6. Apparatus for processing IC components as in claim 5 in which the leaf spring is attached to a tube holder by a plurality of cap screws and the like.

7. Apparatus for processing IC components as in claim 1 in which there is provided a spring-actuated cam disposed below the base plate, this spring-actuated cam adapted to engage the pivoted arm at its lower extent and assist in retaining this arm and the feed wheel carried thereby in a placed position so that this feed wheel and its tire portion is in the desired driving condition.

8. Apparatus for processing IC components is in claim 7 in which the pivoted arm, when swung to its up and non-driving position, is limited in its upward swing by an edge of a cutout provided in the base plate.

9. Apparatus for processing IC components as in claim 8 in which the belt means extending between the clutch shaft and the feed wheel shaft is a driven timing belt pulley carried by and on the clutch shaft and a driven timing belt pulley carried by and on the feed wheel shaft and a timing belt extending between and on said timing belt pulleys to provide a driving relationship, this pivoted arm and the belt passing through the cutout in the base plate.

10. Apparatus for processing IC components as in claim 1 in which the drive means to rotate said pair of shafts includes a motor drive shaft and a timing belt pulley carried thereon and moving a timing belt connected to and moving another driven timing belt pulley carried on said first shaft and a timing belt adapted to move a second shaft and a driven timing belt pulley carried on said second shaft.

11. Apparatus for processing IC components as in claim 10 in which the timing belt extending between the timing belt pulleys carried on and rotating the first and second shafts includes a tightening roller carried by and on a swinging arm which is selectively tightened and secured to provide the desired tension in the timing belt.

12. Apparatus for processing IC components as in claim 10 in which the reciprocated portion in each die is moved by pin means transcribing an orbital path and extending from each of the first and second shafts and with these pin means one-hundred and eighty degrees out-of-phase with the other, these pin means adapted to be operatively connected to the reciprocated die portion.

13. Apparatus for processing IC components as in claim 1 in which each removable tube holder is made to accept only a specifically sized component in which the leads thereof have a determined spacing therebetween.

14. Apparatus for processing IC components as in claim 1 in which the removable center and lower guides include guide members with dual lead guiding capabilities to accommodate lead spacing of both three and six tenths of an inch and with channel guide portions for the leads including beveled channel guide entrances.

15. Apparatus for processing IC components as in claim 1 in which the removable center and lower guides have channels sized for a lead spacing of four tenths of an inch and each of the channel guide portions include beveled guide entrances.

16. Apparatus for processing IC components as in claim 1 in which the Pitman arm is driven by a pin moved and carried in an orbital path by either the first or second shaft.

17. Apparatus for processing IC components as in claim 1 in which the removable die means in the processing station may be trimming or may be shaping dies.

18. Apparatus for processing IC components as in claim 1 in which the feed wheel shaft has a flat longitudinally formed in at least a portion of its extent, this flat disposed to allow repeated shifting and securing of the feed wheel to the shaft by a set screw and the like carried in and by the feed wheel.

19. Apparatus for processing IC components as in claim 1 in which both the removable upper and lower tube holders and the center and lower guide members are each retained by a clamp member removably tightened and loosened from retaining position by manipulation of a thumb screw carried in a threaded means in the base plate.

20. Apparatus for processing IC components as in claim 1 in which the one-way clutch as is carried in the clutch housing is actuated in response to the movement of the Pitman arm, the clutch housing being cycled in small arc movements around the center line of the rotatable clutch shaft.

21. A method of setting up apparatus for processing the leads of dual in-line IC components which are gravitationally fed from a tubular carrier to a processing station whereat processing of the leads is achieved after which by gravity the now processed IC components are delivered to an accumulation carrier, said method steps including:
   (a) providing a variable speed motor carried by a base plate, and rotating a pair of shafts carried by said base plate by drive means associated with said motor;
   (b) carrying and moving a Pitman arm by said drive means and programming a first end of the Pitman arm so as to move in an orbital path around the axis of one of the shafts and attaching the other end of said Pitman arm to and reciprocably moving a clutch housing carried by a rotatable clutch shaft;
   (c) mounting a one-way clutch in said clutch housing so as to rotate said clutch shaft in like incremental arc-like movements and in only a determined one-way direction and carrying said clutch shaft below said base plate;
   (d) securing and mounting a pivotally swung feed wheel arm on said clutch shaft so that said arm is movable in an arc around said clutch shaft;
   (e) rotatably carrying a feed wheel shaft at the other end of said pivotally swung arm, and at one portion of said feed wheel shaft carrying a selectively positioned feed wheel on which is mounted a resilient tire;
   (f) operatively connecting by belt means so as to move the feed wheel shaft as the clutch shaft is moved and rotating the feed wheel shaft in like arc increments as the clutch shaft is rotated, the resilient tire on the feed wheel when brought into driving engagement with an upper surface of a body of an IC component therewith an providing advancing and metering means;
   (g) removably securing to the base plate an upper (rear) tube holder, said holder adapted to receive and deliver IC components having like center spacing between leads, and disposing said holder so that in mounted condition the IC components are delivered by gravity to the resilient tire on the feed wheel;
   (h) providing and removably securing to the base plate and between the tube holder and tire of the feed wheel a slide guide by which the IC components are gravitationally delivered to a processing station;
   (i) removably securing to said base plate a pair of die means with one of the die means disposed on one side of the feed wheel tire and the other die means disposed on the other side, each of said die means reciprocably moved by an arm operatively connected to the die means and moved by one of the shafts carried by said base plate;
   (j) providing and removably securing to the base plate and subsequent to the die means a lower slide guide adapted to receive the processed IC component, and
   (k) removably securing to the base plate a lower tube holder (front), said holder adapted to receive an IC carrier with the processed IC components still retaining their determind lead length and spacing.

22. The method of setting up apparatus for processing leads of IC components as in claim 21 and including the further step of adjusting the feed wheel and the resilient tire thereon by a thumb screw carried in a threaded aperture in the arm carrying the feed wheel shaft.

23. The method of setting up apparatus for processing leads of IC components as in claim 21 and including the further step of providing and securing to each of the longitudinal sides of each of the upper and lower tube holders a leaf spring which is canted to provide an easy entryway of the holder with the spring having a freely movable spring finger portion adapted to be moved by the bias toward the holder.

24. The method of setting up apparatus for processing leads of IC components as in claim 21 and including the further step of providing and securing to a support of the clutch shaft a spring-actuated cam adapted to engage the pivoted feed wheel arm so as to maintain the feed wheel arm in the placed driving condition with the tire portion adapted to contact the body of an IC component to provide a metering and advancing force.

25. The method of setting up apparatus for processing leads of IC components as in claim 21 and including the further step of forming a cutout in the base plate and through this cutout pivotally carrying the feed wheel arm by the clutch shaft and driving a timing belt pulley secured to said shaft, this pulley moving a timing belt in driving engagement with and mounted thereon and with said belt driving a like timing belt pulley mounted on and rotating said feed wheel shaft, the timing belt extending through the formed cutout in the base plate.

26. The method of setting up apparatus for processing leads of IC components as in claim 21 which includes the further step of providing removable center and lower guides and with one set of guides configured to provide channels for both three and six tenths inch spacing of leads and with another set of guides configured to provide channels for four tenths inch spacing of leads.

27. The method of setting up apparatus for processing leads of IC components as in claim 21 which includes the further step of providing the removable tube holders and the guide members with shoulders which are engaged by clamp members tightened and loosened by manipulating a thumb screw associated with each clamp.

* * * * *